United States Patent [19]

Plante et al.

[11] 4,288,745
[45] Sep. 8, 1981

[54] PRINTED CIRCUIT BOARD TESTING MEANS

[75] Inventors: James E. Plante, Attleboro, Mass.; Warren E. Pfeifer, North Kingstown, R.I.

[73] Assignee: Ostby & Barton Company, Providence, R.I.

[21] Appl. No.: 171,093

[22] Filed: Jul. 22, 1980

[51] Int. Cl.³ .................... G01R 31/02; G01R 15/12
[52] U.S. Cl. ........................... 324/158 F; 324/73 PC
[58] Field of Search ........... 324/158 F, 158 P, 73 AT, 324/73 PC, 72.5

[56] References Cited

U.S. PATENT DOCUMENTS

| | | | |
|---|---|---|---|
| 3,757,219 | 9/1973 | Aksu | 324/158 F |
| 3,970,934 | 7/1976 | Aksu | 324/158 F |
| 4,160,207 | 7/1979 | Haines | 324/158 F |
| 4,230,985 | 10/1980 | Matrone et al. | 324/158 F |

OTHER PUBLICATIONS

Series 33 Interface Adaptor; Everett/Charles, Inc.; Pomona, Ca. Brochure, 1 page.
Pylon U-3000 Series Brochure; Pylon Company, Inc., Attleboro, Mass.; pp. 4 and 5.

*Primary Examiner*—Ernest F. Karlsen
*Attorney, Agent, or Firm*—Barlow & Barlow

[57] ABSTRACT

A printed circuit board testing means is disclosed comprising a rectangularly-shaped base structure having a forwardly inclined top front face that is oriented continuously to an interchangeable hinged top mounted platen structure resting thereon which incorporates a pair of fixedly mounted guide rails. A ledge-like structure located at the front edge of the top mounted platen is adjacent to a locating contact pin module incorporated in said platen structure and has guide pins.

A test head interface assembly is slid into co-planar contact and alignment with the platen structure utilizing the guide rail means and ledge guide pins, thereby aligning the locating contact pin modules with the associated test head interface assembly electrical contacts and vacuum source. Movement of a lever operated control interface lowering means incorporated in the base structure housing will then lower the test head interface assembly into electrical contact and vacuum contact with the locating contact pin modules. At the same time vacuum source interconnections between both the test head interface assembly and the platen structure are established.

5 Claims, 6 Drawing Figures

PRINTED CIRCUIT BOARD TESTING MEANS

BACKGROUND OF THE INVENTION

This invention relates to the field of automatic testing of electronic printed circuit boards. This invention relates more particularly to the test fixtures used in automatic test systems designed for the testing of electronic printed circuit boards.

This invention relates to the test fixtures for the automatic testing of electronic printed circuit boards that are interchangeable for variously configured printed circuit boards.

This invention further relates to a fixture for testing printed circuit boards in which a test head interface part wired for a particular board may be easily removed and replaced with another test head wired for another printed circuit board to be later tested.

In the prior art, printed circuit board testers have embodied complete fixtures that do not lend themselves to easy handling particularly when the fixtures are loaded onto the testing circuit base. For example, loading devices as seen in U.S. Pat. No. 3,970,934 are difficult for an inexperienced person to use and many are arranged to accept only a board such as in U.S. Pat. No. 4,169,207 so that the complete device is in use for a time period longer than necessary. The use of test head interface assemblies that can be preloaded and then placed on a testing base, will increase productivity.

In the present invention the test head interface assembly and base are easily separable so that the base may remain hinged to the console and a test head interface assembly adapted to test a particular printed circuit board may be removed and replaced by another test head interface assembly that is adapted to test a different printed circuit or circuits.

The base is adapted to remain on the console with a multiplicity of electrical contacts available. For connection to those associated contacts in the console, the contacts and wires in the base extending from the console connections are fitted into a plurality of multiple connectors which are secured to the base. Each of these base connectors is adapted to be made with a matching connector in the test head interface assembly being tested.

SUMMARY OF THE INVENTION

The present invention is a printed circuit board testing means which allows for the easy and rapid interchangeability of test head interface assemblies for the testing of different printed circuit boards and/or different circuits.

The present invention also allows for the safe and precise interchangeability of test head interface assemblies by eliminating previously commonplace damage to the electrical contacts locating pins during the changing of the test heads.

As the locating pins are arranged safely within the top platen surface of the present invention and are connected to the opposite contacts on the test head assembly following the lowering of the device of the test head interface assembly, damage to the delicate locating contact pins is thereby avoided.

It is therefore an object of the present invention to provide a means for testing printed circuit boards in which a test head interface assembly wired for a particular printed circuit board, may be easily and safely removed and replaced with another test head interface assembly wired for another printed circuit board to be subsequently tested.

It is also an object of the present invention to provide a printed circuit board testing means of the type indicated which can be easily adapted for use with test head interface assembly systems which employ vacuum for the operation of their assemblies.

It is also an important object of the present invention to provide a test fixture of the type indicated, which will be relatively uncomplicated, economical to produce, and reliable in operation.

The above and other objects are accomplished by the apparatus of the present invention. The features of the present invention which are believed to be novel are set forth with particularity in the appended claims. The present invention both as to its organization and the manner of operation, together with further objects and advantages thereof, may be understood best by reference to the following description taken in connection with the accompanying drawings.

DESCRIPTION OF THE PREFERRED EMBODIMENT

Figure 1:
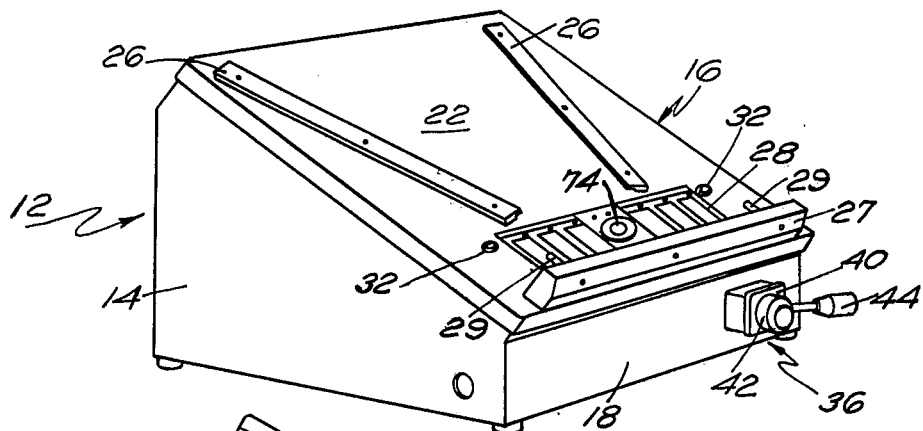
FIG. 1 is a perspective view of the printed circuit board testing means of the present invention without the associated test head interface assembly in position.

Referring to the drawings and more particularly to FIG. 1, which is a perspective view of the printed circuit board testing means of the present invention, without the associated test head interface assembly in position, the printed circuit board testing means is generally designated as 10. The base structure is generally designated as 12 and comprises a generally rectangularly shaped structure. A forwardly inclined top front face is formed by the truncating of side wall panels 14 and 16 respectively. Front wall panel 18 and rear wall panel 20, together completes the base structure 12.

Resting on the base structure 12 is a hinged and readily interchangeable rectangularly-shaped platen structure 22. Hinging of platen 22 is accomplished by means of a plurality of hinges 24, which are affixed to both the undersurface of the platen 22, as well as to the upper portion of the rear wall 20. The hinging arrangement of the platen structure 22 allows for its rapid interchangeability for test heads of various dimensions. The present system has accommodated test heads from 8 by 10 inches to 18 by 24 inches in configuration. It is to be understood, however, that the present invention will readily adapt test heads of other dimensions as well.

Arranged fixedly upon the top surface of the test platen 22 is a plurality of test head interface assembly guide rails 26. These guide rails 26 are arranged in a generally V-shaped configuration, extending from the upper outer edges of the platen 22 and extending toward contact pin module 28 having a plurality of electrical connecting means. The purpose of the guide rails 26 is to serve as both the orienting and aligning means for the control and safe placement of the test head interface assembly means 30 into proper relationship with the base structure 12. These guide rails 26 further allow an operator to position the test head interface assembly means 30 over the base structure 12 properly, regardless of the test head interface assembly means 30 outer dimensions.

Also located at the lower edge of the test platen 22, and extending along most of its width, is an elongated rectangularly-shaped guide ledge 27. Attached to and extending outward from the inner directed face of this guide ledge 27 are a plurality of guide ledge positioning pins 29.

Figure 2:
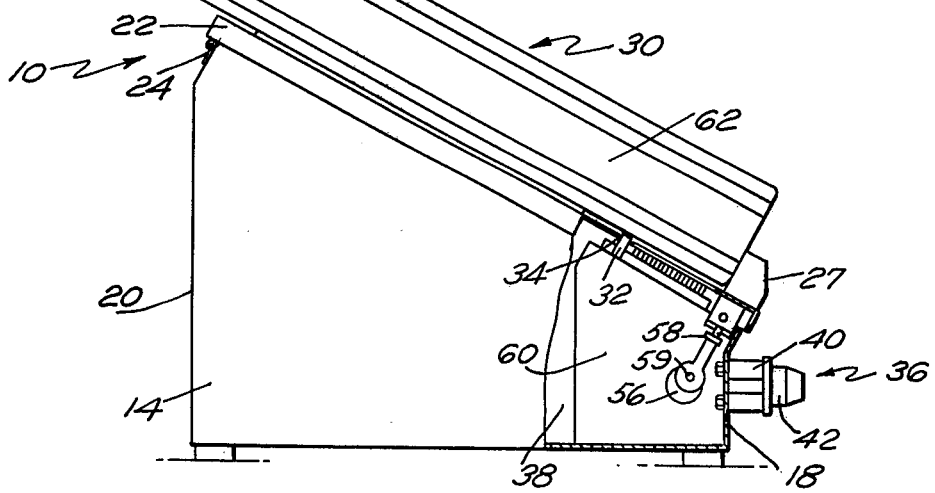
FIG. 2 is a side elevational cutaway view of the printed circuit board testing means of the present invention with a test head interface assembly in the raised position.

Also located near the upper edge of the locating contact pin module 28 are a plurality of contact protecting pins 32. These protecting pins 32 located in brackets 60 extend thru apertures 34 located within the platen 22. These pins 32 extend thru the platen when the same is in lowered position (see FIG. 4) preventing a test head interface assembly from sliding into connections 28 and damaging the same when the platen is raised as seen in FIG. 2. The ends of the pins 32 are flush therewith.

Figure 3:
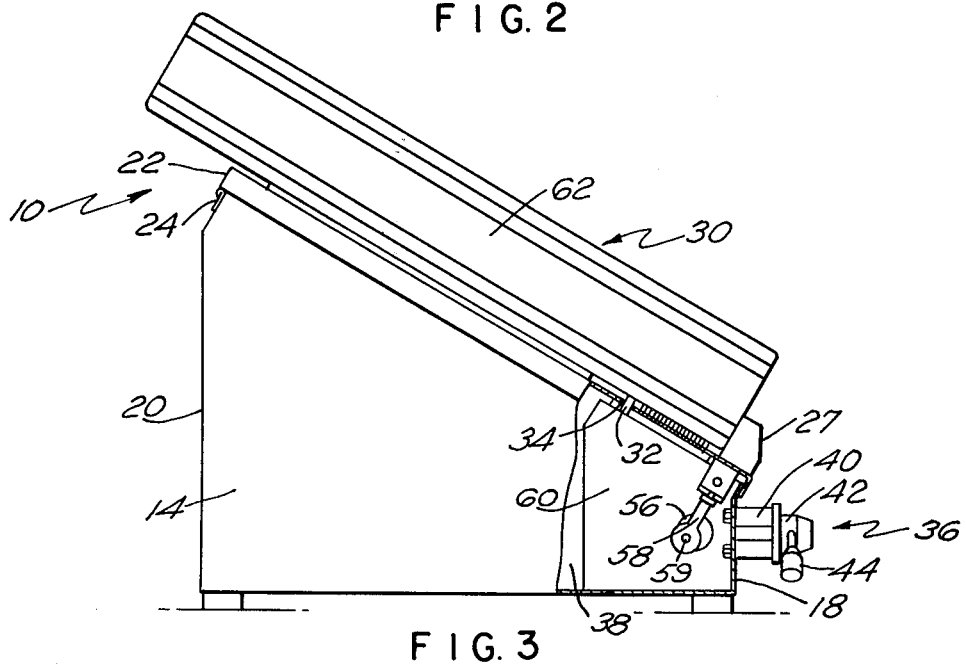
FIG. 3 is a side elevational cutaway view of the printed circuit board testing means of the present invention with a test head interface assembly in the lowered position.
Figure 4:
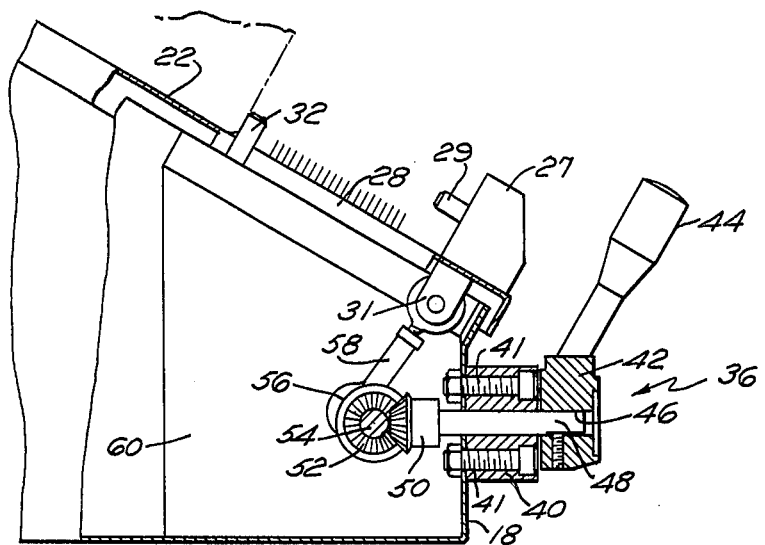
FIG. 4 is a side elevational fragmentary cutaway view of the printed circuit board testing means of the present invention detailing the test head assembly elevating means.
Figure 6:
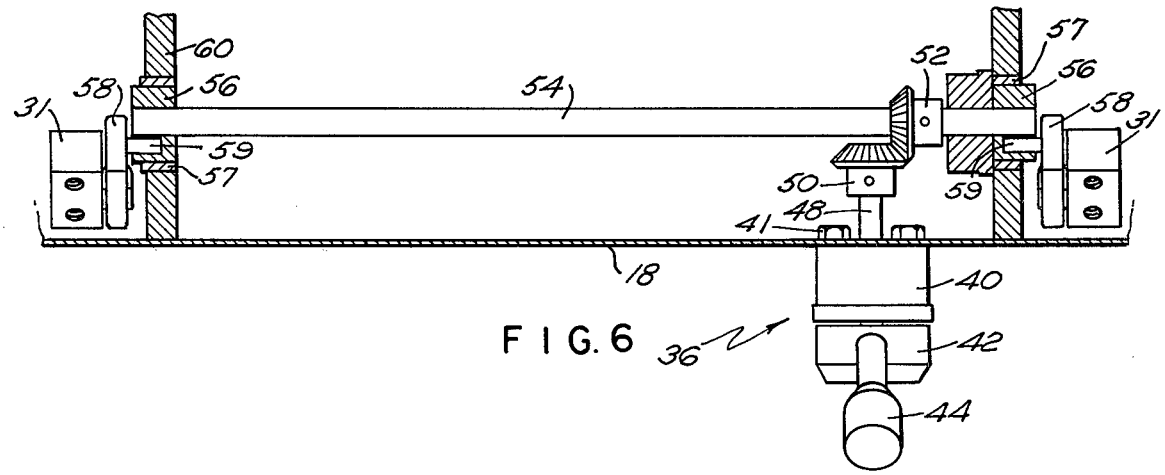
FIG. 6 is a fragmentary top elevational view of the test head assembly elevating means of the present invention.

FIGS. 2 and 3 are side elevational cutaway views of the printed circuit board testing means of the present invention with a test head interface assembly in position. The test head interface assembly elevating control means is depicted generally as 36. This control means is located for the most part within the interior chamber 38 of the base structure 12 and the details thereof are best seen in FIGS. 4 and 6.

Attached to the outer surface of the front wall panel 18 is the control lever housing means 40 which is suitably fastened to panel 18 as by means of belts and nuts 41. Mounted in the central region of this lever housing 40 is a generally cylindrical control lever shaft 42. Attached at a point on the outward projecting periphery of this control lever shaft 42 is a control lever handle 44. This control lever handle is screwed firmly into the external periphery of the aforementioned control lever shaft 42. The control lever shaft 42 is counter rotatable by applying force to the attached control lever handle 44 in either a clockwise or a counterclockwise direction.

Mounted fixedly within the centrally arranged interior cavity 46 of the control lever shaft 42 is one end of a gear shaft 48. Attached to the opposite end of this gear shaft 48 is a bevel gear 50. Bevel gear 50 engages and is arranged at right angles to a similarly configured bevel gear 52, which is fastened securely to an elongated shaft 54 that is mounted rotatably in brackets 60.

Rotation of gear shaft 48, by means of a control movement of the control lever shaft 42, results in a rotation of bevel gear 50 along with a simultaneous rotation of bevel gear 52, as well as shaft 54.

Eccentric cams 56 are received in bearings 57 for rotation and are fastened to shaft 54. Link rods 58 have a pin 59 received in cams 56 while the other end is attached to a bracket 31 affixed to the platen 22.

In operation, after accurate operator guiding and positioning of the test head interface assembly 30, by means of the utilization of both the guide rails 26 and the lower placed guide ledge 27, with their incorporated guide ledge positioning pins 29, the test head interface assembly 30 is then precisely raised or lowered by operator manipulation of the elevating control means 36 as described above.

The lowering and raising of the test head interface assembly 30 results in both the connection and interconnection, respectively, of both the electrical and vacuum connections situated in both the base structure 12 and platen 22, and the test head interface assembly 30. FIGS. 2 and 3 depict the test head interface assembly 30 in both the raised and lowered positions respectively.

Figure 5:
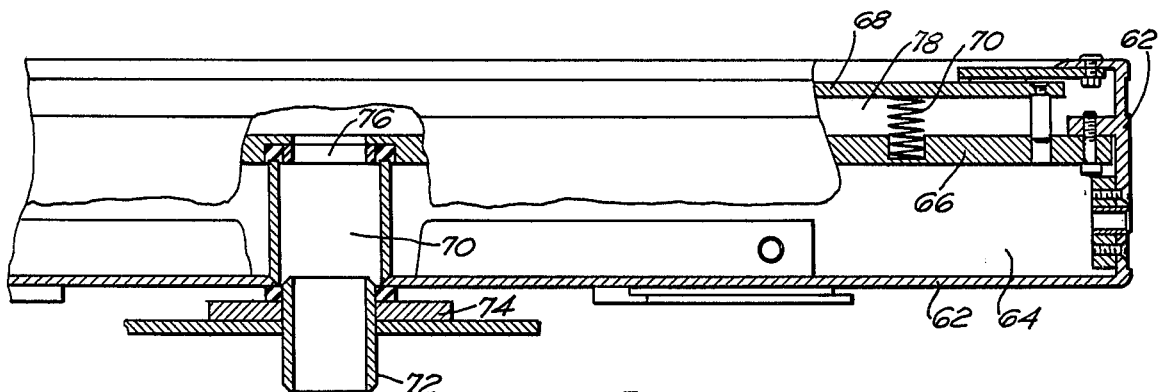
FIG. 5 is a side elevational fragmentary cutaway view of the test head interface assembly of the present invention.

FIG. 5 is a side elevational fragmentary cutaway view of the test head interface assembly of the present invention. The test head interface assembly 30 is essentially a rectangularly-shaped or box-like structure. The housing is comprised of joined sections 62 forming the sides and bottom of the assembly. An interior interface compartment 64 is completed by the presence of interface assembly separator plate 66.

Situated-co-planarly above the interface assembly separator plate 66 is a floating printed circuit board test platen 68. This spring mounted test platen 68 is supported by a plurality of platen springs 70 that are set within the upper surfaces of the separator plate 66 and support the undersurface of the test platen 68. In the usual operation of the assembly, a printed circuit board to be tested would be placed co-planarly on the test platen 68.

A vacuum channel 70 is located within the interface compartment 64. The vacuum channel outlet 72 is designed to fit into a vacuum inlet 74 located in the region of the locating contact pin module 28 mounted on the platen 22.

A vacuum connector opening 76 leads to a test platen compartment 78. As the test head interface assembly 30 is lowered into position on the base structure 12, as described above, the vacuum channel outlet 72 fits securely into the vacuum inlet 74. Vacuum is then applied to the testing means and now causes a downward movement of the test platen 68, with its associated printed circuit board (not shown) in position on its upper surface. The electrical connecting means comprising contacts located in the test head interface assembly 30 and the electrical connecting means comprising contacts in modules 28 in the lower base structure 12 are now connected and activated and the printed circuit board testing can be carried out in the conventional manner.

The above invention has been described by reference to the illustrated and presently preferred embodiments thereof. It is not intended that the invention be unduly limited by this disclosure or presently preferred embodiments. Instead, it is intended that the invention be defined by the means and obvious equivalents thereof set forth in the following claims.

We claim:

1. A printed circuit board testing means, comprising in combination:

a housing having an essentially rectangularly-shaped, truncated, box-like structure, having a forward sloping upper surface with a platen means secured thereto;

a test head interface assembly adapted to be received on said platen;

said platen having at least a pair of guide rails in a V-shaped configuration on the surface thereof;

said test head assembly having a plurality of guide rails to engage the platen rails and align the test head assembly on said platen;

a means for elevating and lowering said platen;

electrical connecting means incorporated in said housing and said test head interface assembly, said guide rails on said platen and said housing positioned to direct the test head assembly to a predetermined location on the platen, whereby when the platen is lowered the connecting means are mated.

2. A printed circuit board testing means as in claim 1, wherein the said interchangeable platen means is hinged at its uppermost end to the said housing means.

3. A printed circuit board testing means as in claim 1, wherein the means for elevating and lowering said test head interface assembly comprises in combination:

a test platen hinged to said housing;

a control lever housing means;

a control lever shaft;

said control lever shaft situated in said control lever housing;

a control lever handle;

said control lever handle attached to said control lever shaft;

a gear shaft;

said gear shaft mounted fixedly in one end of said control lever shaft;

a plurality of bevel gears;

said bevel gears being rotated by motion applied to said control lever handle;

a plurality of connecting rods;

a plurality of eccentric cams;

said connecting rods and said eccentric cams transmitting applied force from said bevel gears to said test platen whereby said test head interface assembly may be raised and lowered.

4. A printed circuit board testing means as in claim 1, wherein a guide ledge having attached positioning pins is located adjacent one edge of said platen and wherein said test head interface assembly is provided with mating sockets to receive said pins.

5. A printed circuit board testing means as in claim 1, wherein a vacuum connection means is located within the field of the electrical testing means incorporated in said housing and in said test head assembly, whereby when said electrical circuits are completed, said vacuum system connections are also completed which occurs upon the lowering of said platen.

* * * * *